United States Patent
Jalilizeinali et al.

(10) Patent No.: US 9,368,648 B2
(45) Date of Patent: Jun. 14, 2016

(54) ACTIVE DIODE HAVING NO GATE AND NO SHALLOW TRENCH ISOLATION

(75) Inventors: Reza Jalilizeinali, Oceanside, CA (US); Eugene R. Worley, Irvine, CA (US); Evan Siansuri, San Diego, CA (US); Sreeker R. Dundigal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 436 days.

(21) Appl. No.: 12/751,903

(22) Filed: Mar. 31, 2010

(65) Prior Publication Data

US 2011/0084362 A1    Apr. 14, 2011

Related U.S. Application Data

(60) Provisional application No. 61/166,207, filed on Apr. 2, 2009.

(51) Int. Cl.
| | | |
|---|---|---|
| H01L 27/02 | (2006.01) | |
| H01L 29/861 | (2006.01) | |
| H01L 29/66 | (2006.01) | |
| H01L 29/06 | (2006.01) | |

(52) U.S. Cl.
CPC ...... *H01L 29/8611* (2013.01); *H01L 29/66128* (2013.01); *H01L 29/0692* (2013.01)

(58) Field of Classification Search
CPC ................. H01L 29/66128; H01L 29/8611; H01L 29/0692
USPC ............................ 257/546, E29.327, E21.546
See application file for complete search history.

(56) References Cited

U.S. PATENT DOCUMENTS

| | | |
|---|---|---|
| 6,015,993 A | 1/2000 | Voldman et al. |
| 6,407,429 B1 | 6/2002 | Ko et al. |
| 6,933,573 B2 | 8/2005 | Ker et al. |

(Continued)

FOREIGN PATENT DOCUMENTS

| | | |
|---|---|---|
| JP | S63185069 A | 7/1988 |
| JP | 2002118267 A | 4/2002 |

(Continued)

OTHER PUBLICATIONS

International Search Report and Written Opinion—PCT/US2010/029830, International Search Authority—European Patent Office—Jul. 5, 2010.

(Continued)

*Primary Examiner* — Vongsavanh Sengdara
(74) *Attorney, Agent, or Firm* — Donald D. Min; Paul Holdaway (57) ABSTRACT

An active diode with fast turn-on time, low capacitance, and low turn-on resistance may be manufactured without a gate and without a shallow trench isolation region between doped regions of the diode. A short conduction path in the active diode allows a fast turn-on time, and a lack of gate oxide reduces susceptibility of the active diode to extreme voltages. The active diode may be implemented in integrated circuits to prevent and reduce damage from electrostatic discharge (ESD) events. Manufacturing the active diode is accomplished by depositing a salicide block between doped regions of the diode before salicidation. After the salicide layers are formed on the doped regions, the salicide block is removed.

8 Claims, 9 Drawing Sheets

(56) References Cited

U.S. PATENT DOCUMENTS

| | | | |
|---|---|---|---|
| 2002/0100950 A1 | 8/2002 | Babcock et al. | |
| 2003/0059985 A1* | 3/2003 | Adkisson | H01L 27/0664 438/149 |
| 2003/0062540 A1* | 4/2003 | Ker | H01L 27/0251 257/199 |
| 2005/0173727 A1* | 8/2005 | Manna | H01L 27/0262 257/173 |
| 2007/0267700 A1* | 11/2007 | Russ | H01L 27/0255 257/355 |
| 2007/0278542 A1 | 12/2007 | Yuki | |
| 2008/0268585 A1 | 10/2008 | Gehring et al. | |

FOREIGN PATENT DOCUMENTS

| | | |
|---|---|---|
| JP | 2003124222 A | 4/2003 |
| KR | 100436475 | 6/2004 |
| WO | WO02061841 | 8/2002 |

OTHER PUBLICATIONS

Karnik, S. V. et al., "Lateral polysilicon p+-p-n+ and p+-n-n+ diodes", Solid-State Electronics, Apr. 2003, pp. 653-659, vol. 47, Issue 4, Elsevier Science.

Taiwan Search Report—TW099110454—TIPO—Feb. 14, 2014.

* cited by examiner (PRIOR ART)

FIG. 1

(PRIOR ART)

ACTIVE DIODE HAVING NO GATE AND NO SHALLOW TRENCH ISOLATION

CROSS REFERENCE TO RELATED APPLICATION

This application claims the benefit of U.S. Provisional Patent Application No. 61/166,207 entitled "No Poly Gate Diode" to JALILIZEINALI et al., filed Apr. 2, 2009.

TECHNICAL FIELD

The present disclosure generally relates to semiconductor devices. Specifically, the present disclosure relates to diodes.

BACKGROUND

Integrated circuits (ICs) are easily damaged by excess voltages, and the common sources of these potentially damaging voltages include electrostatic discharge (ESD). ESD is a transfer of electrostatic charge between bodies or surfaces at different electrostatic potentials either through direct contact or through an induced electrical field.

ICs built using semiconductors, such as silicon and insulating materials such as silicon dioxide, may be permanently damaged when subjected to high voltages during ESD events. Conventionally, on-chip circuits protect ICs during ESD events. One conventional protection circuits is a shallow trench isolation (STI) diode.

Figure 1:
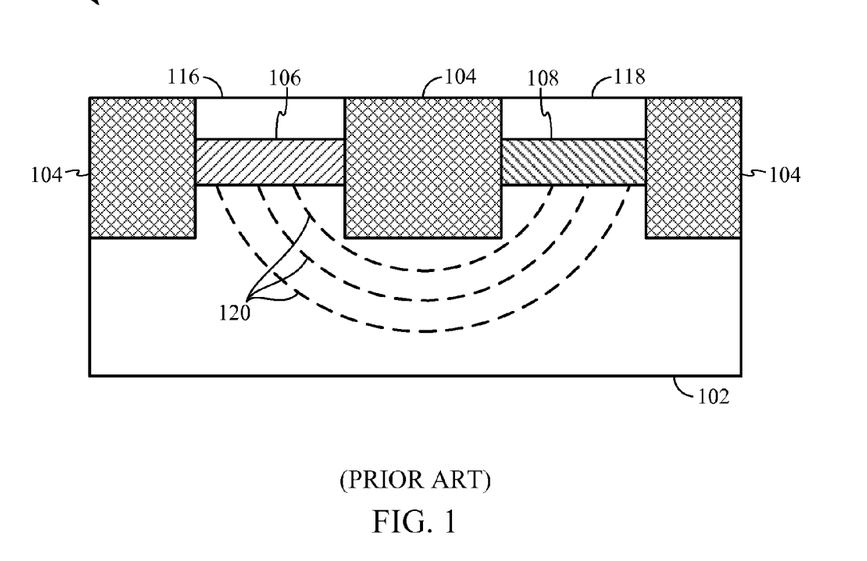
FIG. 1 is a cross-sectional view illustrating a conventional shallow trench isolation diode.

FIG. 1 is a cross-sectional view illustrating a conventional shallow trench isolation (STI) diode. An STI diode 100 includes a substrate 102 having a first doped region 106 (e.g., an N-type region) and a second doped region 108 (e.g., a P-type region). A shallow trench isolation (STI) region 104 separates the first doped region 106 and the second doped region 108. Shallow trench isolation regions 104 are also provided on the periphery of the diode 100. A silicide layer including a silicided portion 116 is formed on the first doped region 106 and a second silicided portion 118 is formed on the second doped region 108. A conduction path 120 for carriers from the first doped region 106 to the second doped region 108 produced by carrier injection extends around the STI region 104 located between the doped regions 106, 108. STI diodes have a long current conduction path 120, which results in a slow turn-on time and a high turn-on resistance.

In certain circuits, such as a low noise amplifier, a high speed diode protects the IC, and especially an input gate, from voltage build up (e.g., overshoot) due to delay in conduction. A gated diode offers faster turn-on time than that of the STI diode by reducing the length of the conduction path.

Figure 2:
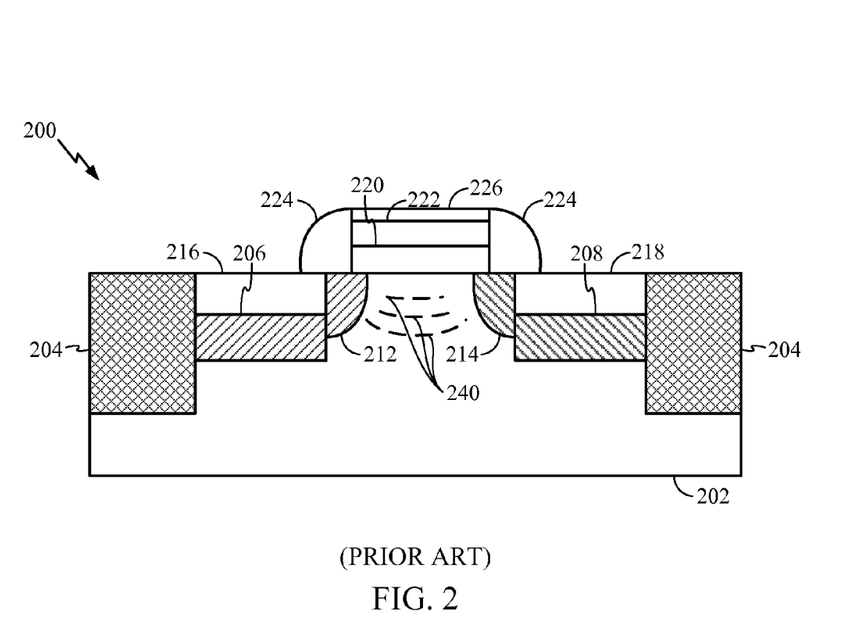
FIG. 2 is a cross-sectional view illustrating a conventional gated diode.

FIG. 2 is a cross-sectional view illustrating a conventional gated diode. A gated diode 200 includes a substrate 202 having a first doped region 206 (e.g., a P-type region) and a second doped region 208 (e.g., an N-type region). Shallow trench isolation (STI) regions 204 are located on the periphery of the diode 200, but not between the doped regions 206, 208. Between the first doped region 206 and the second doped region 208 and on a surface of the substrate 202 a gate includes a gate oxide layer 220, a gate electrode 222, and spacers 224. A first lightly doped region 212 (e.g., a lightly doped drain (LDD) implant) and a second lightly doped region 214 are located between the first doped region 206 and the second doped region 208 and abutted against the first doped region 206 and the second doped region 208, respectively. A salicide layer including a salicide portion 216 is formed on the first doped region 206 and a second salicide portion 218 is formed on the second doped region 208. Likewise, a silicide portion 226 is formed on the gate electrode 222. A conduction path 240 between the doped regions 206, 208 is shorter in the gated diode 200 than the conduction path 120 of the STI diode 100.

The thin gate oxide 220 of the gated diode 200 is susceptible to oxide rupture from over voltages during, for example, ESD events. As ICs are manufactured at smaller sizes, the thickness of the gate oxide 220 decreases and the gated diode 200 becomes more susceptible to oxide rupture. Additionally, the gated diode 200 has a low reverse breakdown voltage and increased capacitance. The increased capacitance in comparison to the STI diode 100 results from intrinsic capacitance between the gate and the doped regions. For example, additional capacitance results from the gate electrode 222 to the first lightly doped region 212 and from the gate electrode 222 to the second lightly doped region 214.

Thus, there is a need for a diode with low turn-on time, low capacitance, low turn-on resistance, reliable operation, and good clamping characteristics.

BRIEF SUMMARY

According to one aspect of the disclosure, a diode includes a first doped region doped with a first dopant in a substrate. The diode also includes a second doped region doped with a second dopant in the substrate. The second dopant has an opposite polarity of the first dopant. The diode also includes a first salicide portion formed on the first doped region. The first salicide portion is defined by a salicide block mask positioned between the first doped region and the second doped region. The diode further includes a second salicide portion formed on the second doped region. The second salicide portion is defined by the salicide block mask.

According to another aspect of the disclosure, a method of manufacturing a diode includes implanting a first doped region defined by a first implant mask. The method also includes implanting a second doped region defined by a second implant mask. The method further includes depositing a salicide block between the first doped region and the second doped region after implanting the second doped region. The method also includes forming a first salicide portion on the first doped region in regions not blocked by the salicide block after depositing the salicide block. The method further includes forming a second salicide portion on the second doped region in regions not blocked by the salicide block after depositing the salicide block. The method also includes stripping the salicide block after forming the second salicide portion.

According to a further aspect of the disclosure, a method of manufacturing a diode includes the step of forming shallow trench isolation regions defined by an active mask. The method also includes the step of implanting a first doped region defined by a first implant mask after forming the shallow trench isolation regions. The method further includes the step of implanting a second doped region defined by a second implant mask after forming the shallow trench isolation regions. The method also includes the step of depositing a salicide block between the first doped region and the second doped region after implanting the second doped region. The method further includes the step of forming a first salicide portion on the first doped region in regions not blocked by the salicide block after depositing the salicide block. The method also includes the step of forming a second salicide portion on the second doped region in regions not blocked by the salicide block after depositing the salicide block. The method further includes the step of stripping the salicide block after forming the second salicide portion.

According to another aspect of the disclosure, a diode includes a first doped region doped with a first dopant. The diode also includes a second doped region doped with a second dopant. The second dopant has an opposite polarity of the first dopant. The diode further includes means for coupling a first contact to the first doped region. The diode also includes means for coupling a second contact to the second doped region. The first coupling means and the second coupling means are defined by a salicide block mask positioned between the first doped region and the second doped region.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

An active diode may be manufactured having a faster-turn on time and reduced susceptibility to high voltages. According to one embodiment, a diode is manufactured without a gate structure and without a shallow trench isolation (STI) region being placed between the doped regions. Without a gate structure no gate oxide is present, which reduces the diode's susceptibility to high voltages. Additionally, without an STI region between doped regions of the diode, a shorter current conduction path is available between the doped regions. This decreases the turn-on time of the diode allowing faster operation.

Figure 3:
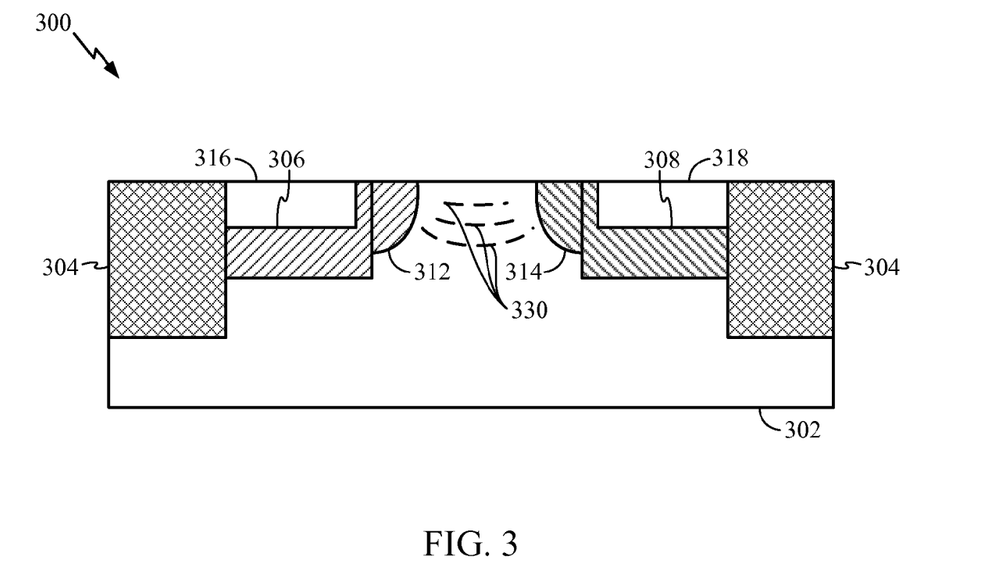
FIG. 3 is a cross-sectional view illustrating an exemplary active diode with lightly doped regions according to one embodiment.

FIG. 3 is a cross-sectional view illustrating an exemplary active diode with lightly doped regions according to one embodiment. An active diode 300 includes a substrate 302 having a first doped region 306 (e.g., a P+-type region) and a second doped region 308 (e.g., an N+-type region). A first lightly doped region 312 is located between the first doped region 306 and the second doped region 308 and abutted against the first doped region 306. A second lightly doped region 314 (e.g., a lightly doped drain (LDD)) is located between the first doped region 306 and the second doped region 308 and abutted against the second doped region 308. A salicide layer including a first salicide portion 316 is formed on the first doped region 306 and also including a second salicide portion 318 is formed on the second doped region 308. In the active diode 300, current conducts between the first doped region 306 and the second doped region 308 along a path substantially parallel to a surface of the substrate 302. At the periphery, STI regions 304 are provided. Without an STI region between the first doped region 306 and the second doped region 308, current conduction occurs along a shorter path 330 than in a conventional STI diode.

Figure 4A:
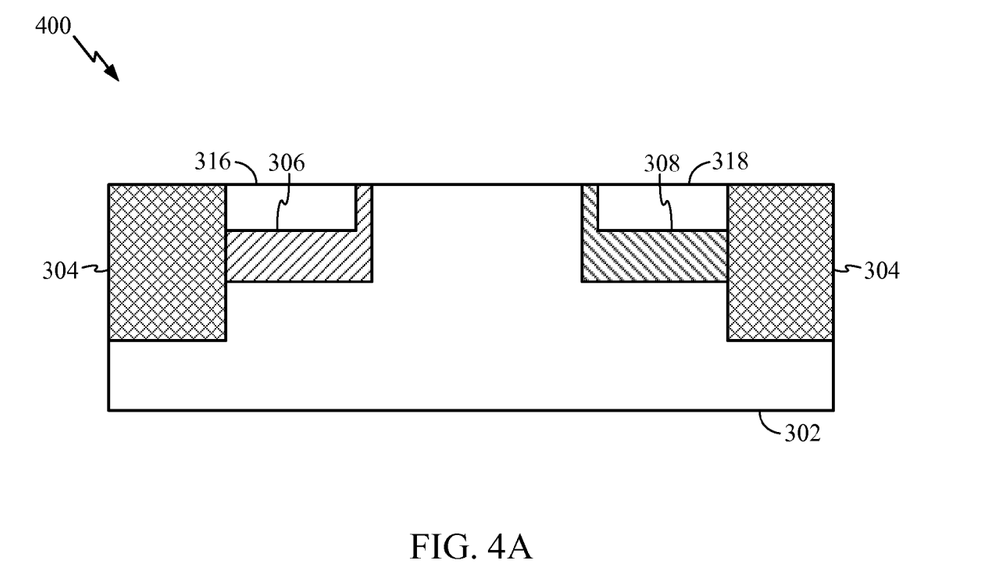
FIG. 4A is a cross-sectional view illustrating an exemplary active diode without lightly doped regions according to one embodiment.
Figure 4B:
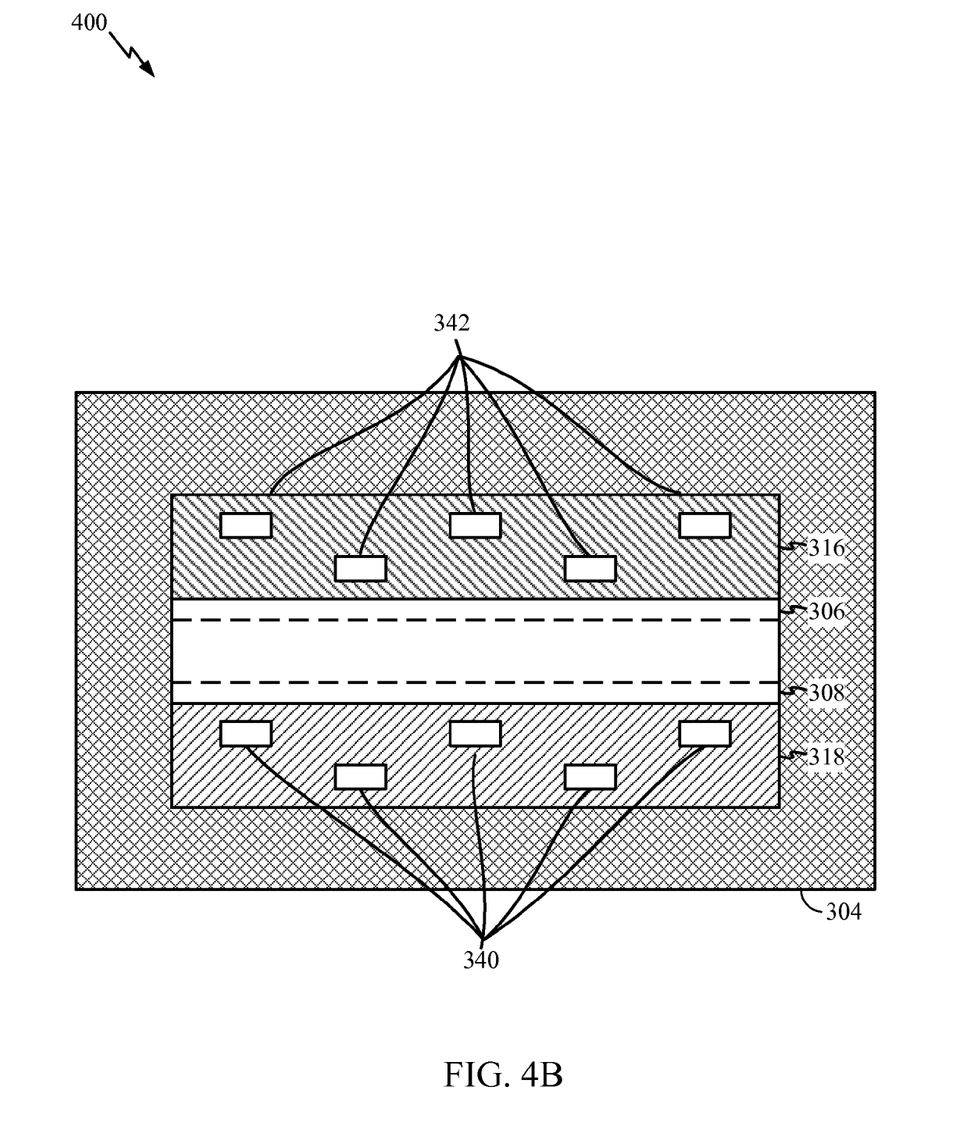
FIG. 4B is a top-down view illustrating an exemplary active diode without lightly doped regions according to one embodiment.

FIG. 4A is a cross-sectional view illustrating an exemplary active diode without lightly doped regions according to one embodiment. FIG. 4B is a top-down view illustrating an exemplary active diode without lightly doped regions according to one embodiment. An active diode 400 includes the first doped region 306 and the second doped region 308. However, no lightly doped regions are located between the first doped region 306 and the second doped region 308. According to one embodiment, the lightly doped regions are prevented from forming between the first doped region 306 and the second doped region 308 by depositing an implant block layer on the substrate 302 during formation of the first doped region 306 and the second doped region 308. Contacts 340 to the salicide portion 318 provide electrical coupling to external components (not shown). Likewise, contacts 342 to the salicide portion 316 provide electrical coupling to external components (not shown). At the periphery, STI regions 304 are provided.

Figure 5:
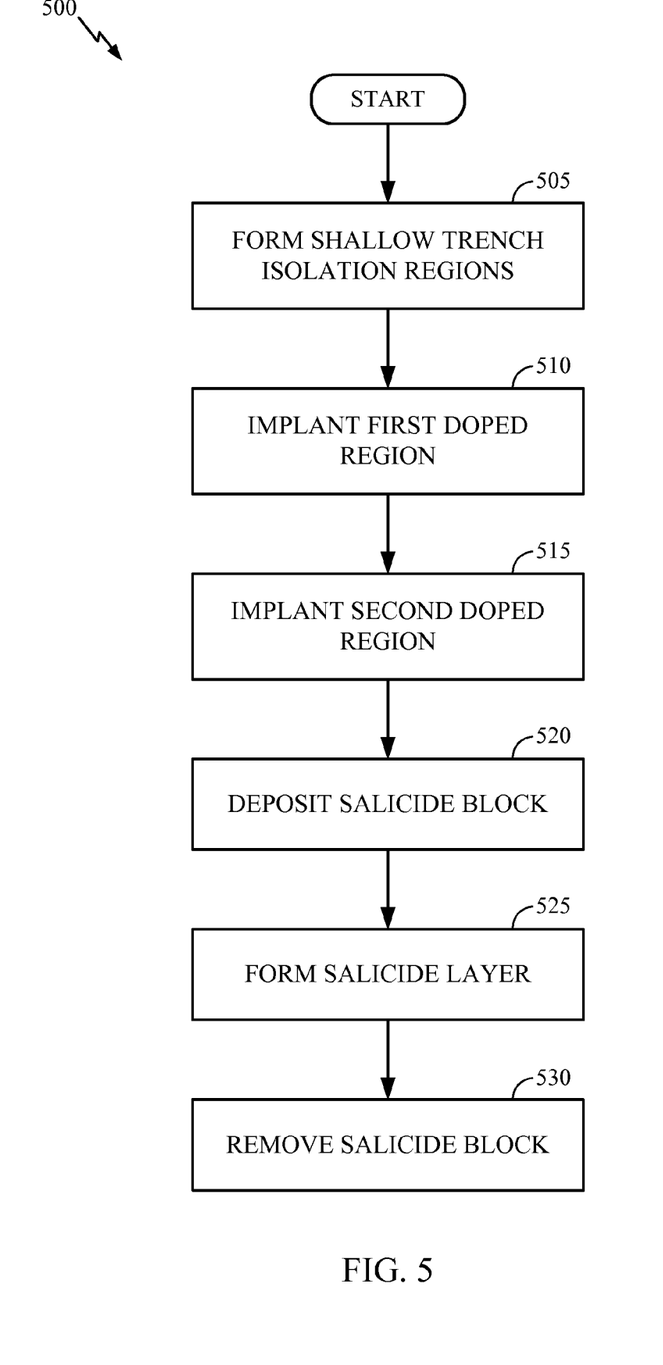
FIG. 5 is a flow chart illustrating an exemplary process for manufacturing an active diode according to one embodiment.
Figure 6A:
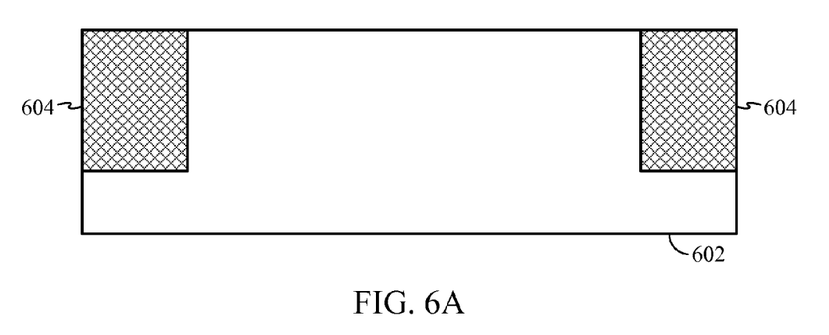
FIG. 6A is a cross-sectional view illustrating a partial exemplary active diode after forming shallow trench isolation regions according to one embodiment.

FIG. 5 is a flow chart illustrating an exemplary process for manufacturing an active diode according to one embodiment. A flow chart 500 starts at block 505 with forming shallow trench isolation (STI) regions. FIG. 6A is a cross-sectional view illustrating a partial exemplary active diode after forming shallow trench isolation regions according to one embodiment. Shallow trench isolation (STI) regions 604 are formed in a substrate 602. The substrate 602 may be, for example, silicon, glass ($SiO_2$), sapphire ($Al_2O_3$), or magnesium oxide (MgO). According to one embodiment, the STI regions 604 are formed by etching trenches (not shown) in the substrate 602 with an active mask, thermally growing oxide (not shown), which covers sidewalls and a bottom of the trench, then depositing an insulated material such as oxide.

Figure 7A:
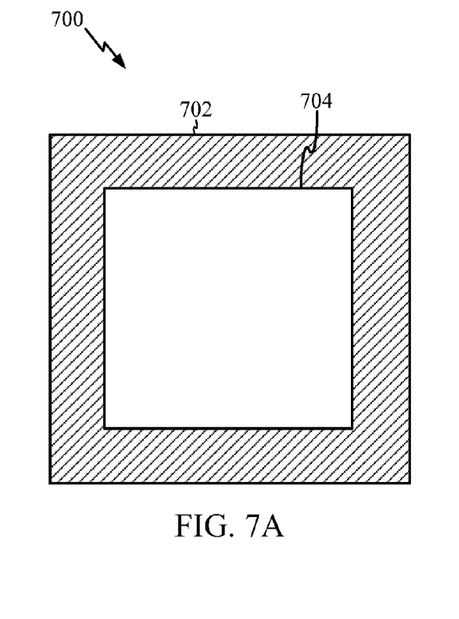
FIG. 7A is a top-down view illustrating an exemplary active mask according to one embodiment.

FIG. 7A is a top-down view illustrating an exemplary active mask according to one embodiment. An active mask 700 includes a first region 702 and a second region 704. The first region 702 and the second region 704 are opposite polarities. That is, if the first region 702 is opaque then the second region 704 is transparent. The second region 704 defines an active window on the substrate 602 into which doped regions may be formed. According to one embodiment, both implant regions are formed within the active window defined by the second region 704. The active mask 700 may alternatively be a photoreticle, a phase shift mask, or a stencil mask.

Figure 6B:
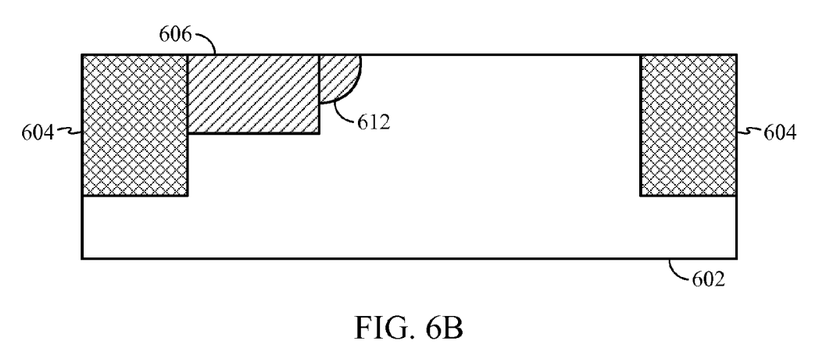
FIG. 6B is a cross-sectional view illustrating a partial exemplary active diode after implanting a first doped region according to one embodiment.

The flow chart 500 continues to block 510 with implanting a first doped region. FIG. 6B is a cross-sectional view illustrating a partial exemplary active diode after implanting a first doped region according to one embodiment. A first doped region 606 and a first lightly doped region 612 are formed in the substrate 602. According to one embodiment, the first doped region 606 abuts against one of the STI regions 604. The first doped region 606 may be implanted with a p-type dopant such as, for example, boron. According to one embodiment, the first doped region 606 is formed by depositing a sacrificial layer (not shown) such as, for example, photoresist on the substrate 602, patterning the sacrificial layer with a first implant mask, implanting regions of the substrate 602 where the sacrificial layer is patterned away, and removing the sacrificial layer.

Figure 7B:
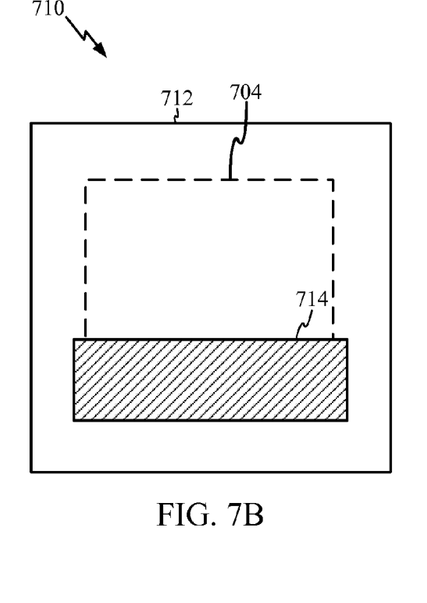
FIG. 7B is a top-down view illustrating an exemplary first implant mask according to one embodiment.

FIG. 7B is a top-down view illustrating an exemplary first implant mask according to one embodiment. A first implant mask 710 includes a first region 712 and a second region 714. The first region 712 and the second region 714 have opposite polarities. That is, if the first region 712 is opaque then the second region 714 is transparent, or vice versa depending on polarity of photoresist used during processing. The first implant mask 710 may alternatively be a photoreticle, a phase shift mask, or a stencil mask.

According to one embodiment, implanting the first dopant region may be performed without forming the first lightly doped region 612. For example, during the patterning of the sacrificial layer, process parameters may be adjusted to form an implant block above the location of the first lightly doped region 612 to prevent formation of the first lightly doped region 612. In another example, the first region 712 and the second region 714 of the first implant mask 710 are adjusted to form an implant block above the location of the first lightly doped region 612 to prevent formation of the first lightly doped region 612.

Figure 6C:
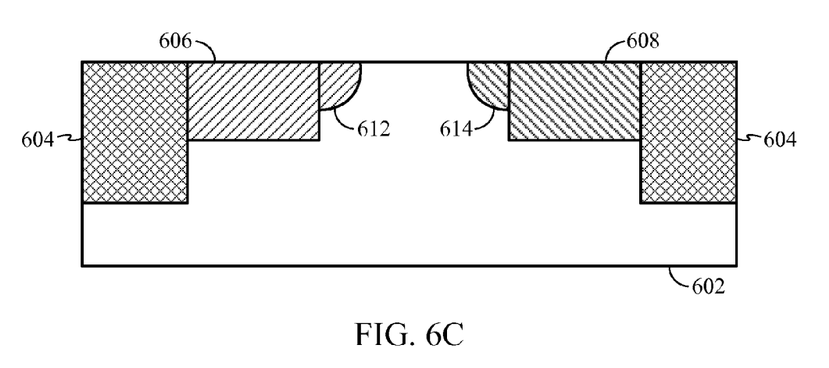
FIG. 6C is a cross-sectional view illustrating a partial exemplary active diode after implanting a second doped region according to one embodiment.

The flow chart 500 continues to block 515 with implanting the second doped region. FIG. 6C is a cross-sectional view illustrating a partial exemplary active diode after implanting a second doped region according to one embodiment. A second doped region 608 and a second lightly doped region 614 are formed in the substrate 602. According to one embodiment, the second doped region 608 abuts against one of the STI regions 604. The second doped region 608 may be implanted with an n-type dopant such as, for example, phosphorous or arsenic. According to one embodiment, the second doped region 608 is formed with a second implant mask.

Figure 7C:
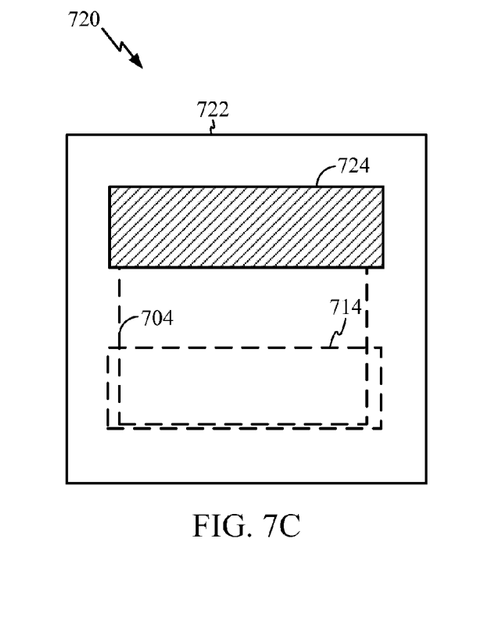
FIG. 7C is a top-down view illustrating an exemplary second implant mask according to one embodiment.

FIG. 7C is a top-down view illustrating an exemplary second implant mask according to one embodiment. A second implant mask 720 includes a first region 722 and a second region 724. The first region 722 and the second region 724 have opposite polarities. That is, if the first region 722 is opaque then the second region 724 is transparent, or vice versa depending on polarity of photoresist used during processing. The second region 724 may be positioned to create a second doped region 608. The second implant mask 720 may alternatively be a photoreticle, a phase shift mask, or a stencil mask.

Figure 6D:
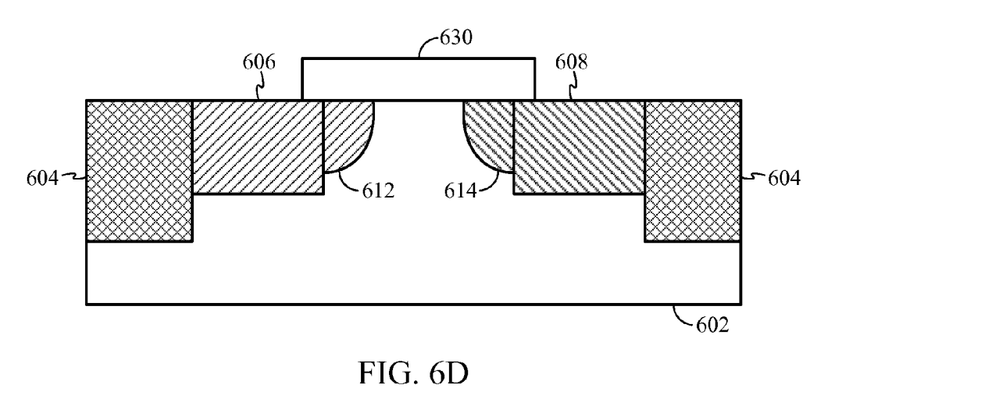
FIG. 6D is a cross-sectional view illustrating a partial exemplary active diode after depositing a salicide block according to one embodiment.

The flow chart 500 continues to block 520 with depositing a salicide block. FIG. 6D is a cross-sectional view illustrating a partial exemplary active diode after depositing a salicide block according to one embodiment. A salicide block 630 is deposited on the substrate 602 substantially between the first doped region 606 and the second doped region 608. The salicide block 630 prevents the formation of salicide on any region of the substrate 602 covered by the salicide block 630. According to one embodiment, the salicide block 630 partially covers the region between the first doped region 606 and the second doped region 608, a portion of the first doped region 606, and a portion of the second doped region 608. The salicide block 630 may be, for example, a photoresist. According to one embodiment, the salicide block 630 is formed with a salicide block mask.

Figure 7D:
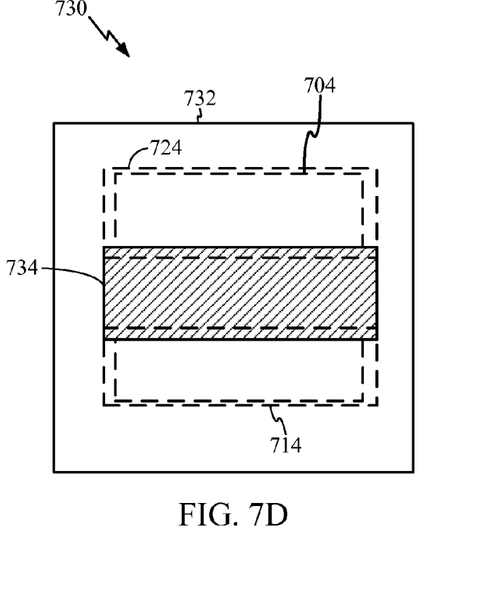
FIG. 7D is a top-down view illustrating an exemplary salicide block mask according to one embodiment.

FIG. 7D is a top-down view illustrating an exemplary salicide block mask according to one embodiment. A salicide block mask 730 includes a first region 732 and a second region 734. The first region 732 and the second region 734 have opposite polarities, or vice versa depending on polarity of photoresist used during processing. That is, if the first region 732 is opaque then the second region 734 is transparent. The salicide block mask 730 may alternatively be a photoreticle, a phase shift mask, or a stencil mask.

Figure 6E:
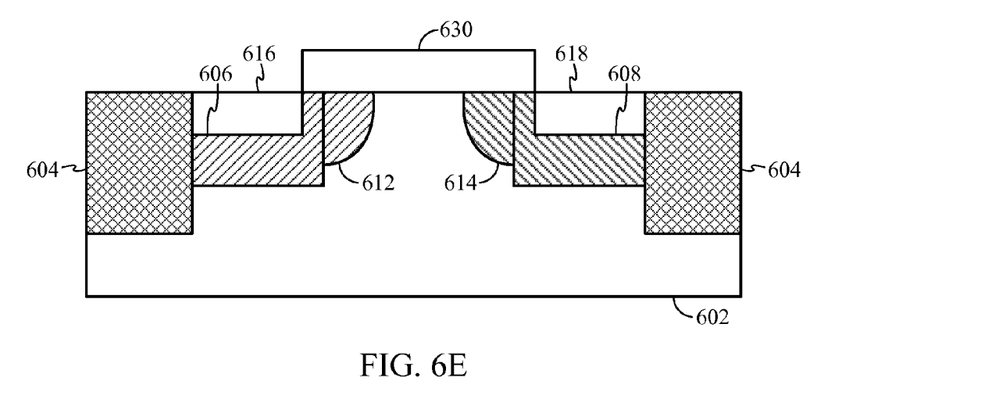
FIG. 6E is a cross-sectional view illustrating a partial exemplary active diode after forming a salicide layer according to one embodiment.

The flow chart 500 continues to block 525 with forming a salicide layer. FIG. 6E is a cross-sectional view illustrating a partial exemplary active diode after forming the salicide layer according to one embodiment. A salicide layer including a first salicide portion 616 is formed on the first doped region 606 and also including a second salicide portion 618 is formed on the second doped region 608. According to one embodiment, the salicide portions 616, 618 are formed by depositing a conductive material (not shown), such as metal, on the substrate 602, elevating the temperature of the substrate 602 to diffuse and alloy the metal into the doped regions 606, 608, and etching the metal that did not alloy with the doped regions 606, 608. The salicide portions 616, 618 may be, for example, cobalt silicide, nickel silicide, or tungsten silicide.

Figure 6F:
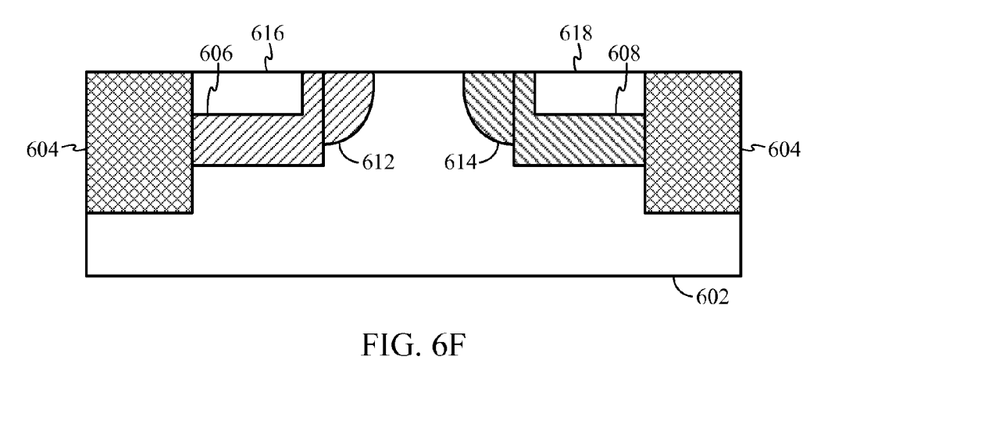
FIG. 6F is a cross-sectional view illustrating a partial exemplary active diode after removing the salicide block according to one embodiment.

The flow chart 500 continues to block 530 with removing the salicide block. FIG. 6F is a cross-sectional view illustrating a partial exemplary active diode after removing the salicide block according to one embodiment. The salicide block 630 is removed from the substrate 602. According to one embodiment, the salicide block 630 is stripped using a wet etch from the substrate 602.

Active diodes without a shallow trench isolation (STI) region between the doped regions and without a gate have an improved turn-on time compared to conventional STI transistors. Additionally, the active diodes have no gate oxide. Thus, the active diodes have an increased tolerance to high voltages and ESD events. The active diode also has a lower capacitance resulting from the lack of a gate, and hence no gate to doped region capacitance. Lower turn-on resistance, a shorter conduction path length, and lower capacitance allows the active diode better clamping characteristics over gated diodes. The active diode described above may be used in an electrostatic discharge (ESD) protection circuit.

Figure 8:
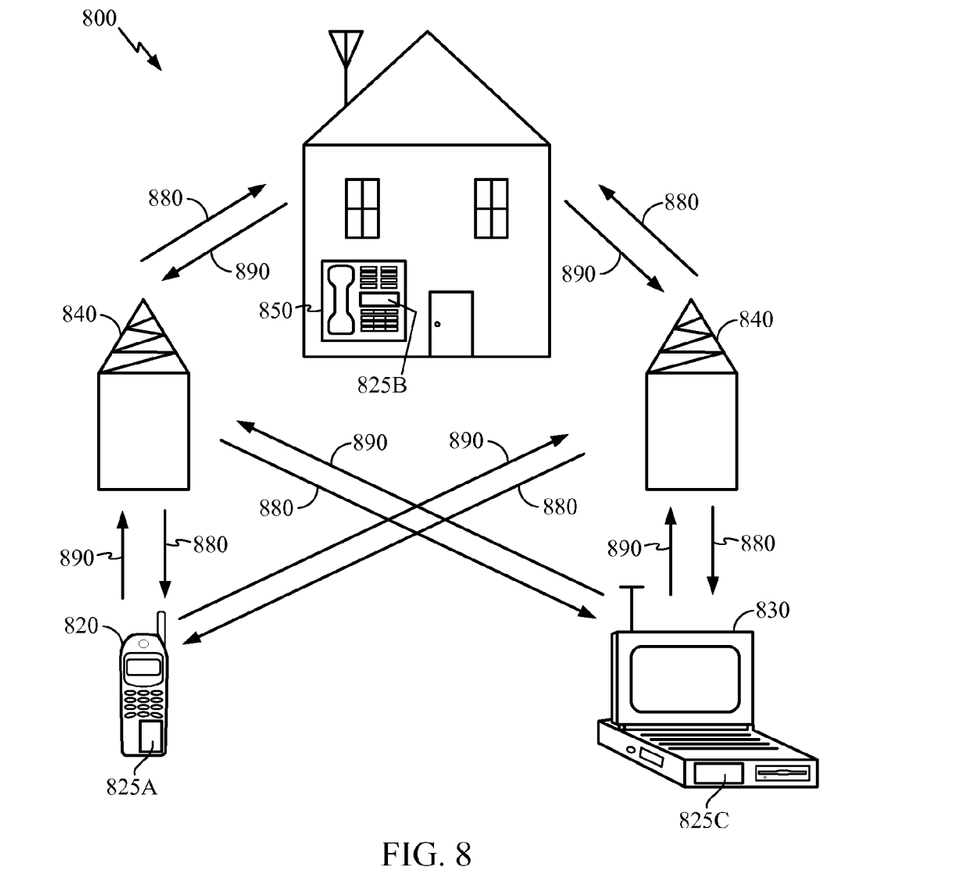
FIG. 8 is a block diagram showing an exemplary wireless communication system in which an embodiment may be advantageously employed.

FIG. 8 shows an exemplary wireless communication system 800 in which an embodiment of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include diodes 825A, 825C, 825B, respectively, which are embodiments as discussed above. FIG. 8 shows forward link signals 880 from the base stations 840 and the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a computer in a wireless local loop system. For example, the remote units may be cell phones, mobile phones, computers, set top boxes, music players, video players, entertainment units, hand-held personal communication systems (PCS) units, portable data units such as personal data assistants, or fixed location data units such as meter reading equipment. Although FIG. 8 illustrates remote units according to the teachings of the disclosure, the disclosure is not limited to these exemplary illustrated units. The disclosure may be suitably employed in any device which includes diodes.

Figure 9:
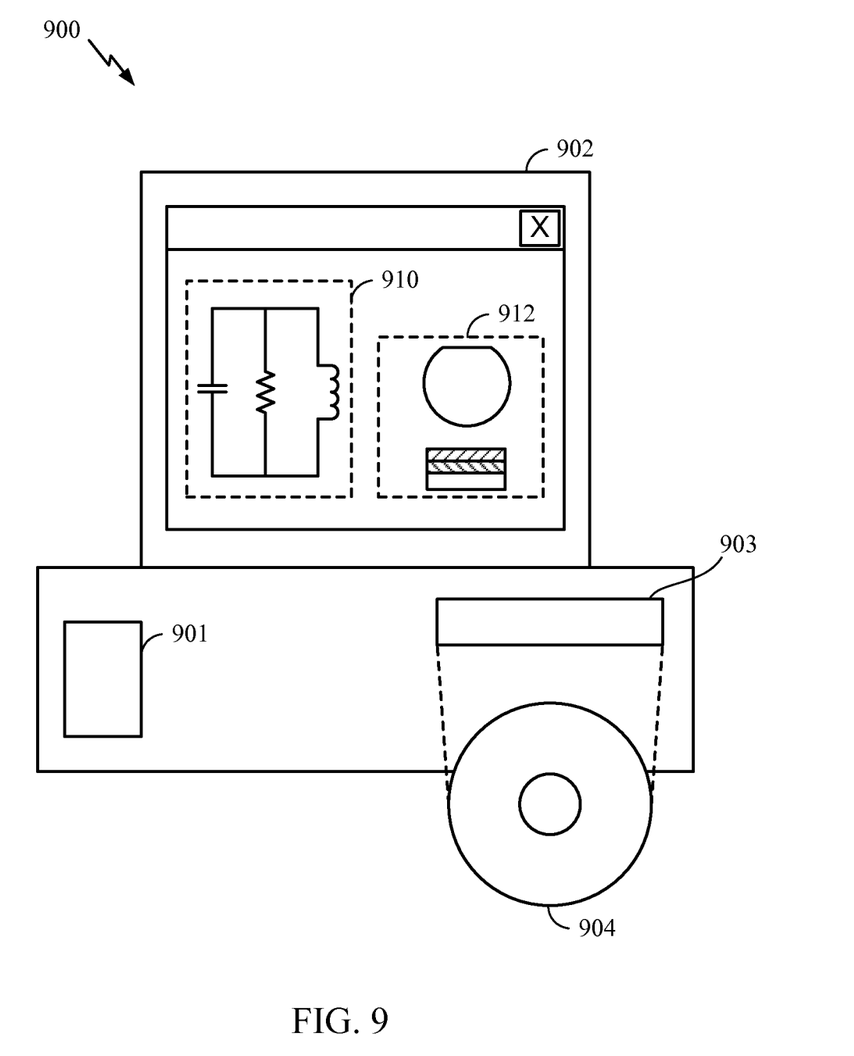
FIG. 9 is a block diagram illustrating a design workstation used for circuit, layout, and logic design of a semiconductor component according to one embodiment.

FIG. 9 is a block diagram illustrating a design workstation used for circuit, layout, and logic design of a semiconductor component, e.g., the diode as disclosed above. A design workstation 900 includes a hard disk 901 containing operating system software, support files, and design software such as Cadence or OrCAD. The design workstation 900 also includes a display to facilitate design of a circuit 910 or a semiconductor component 912 such as the diode discussed above. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A diode, comprising:
   a first doped region doped only with a first dopant;
   a second doped region doped only with a second dopant, the second dopant having an opposite polarity of the first dopant;
   a contiguous, non-doped region separating the first doped region from the second doped region, wherein the non-doped region directly contacts a sidewall of the first doped region and the non-doped region directly contacts a sidewall of the second doped region, and substantially no lightly doped region lies between the second doped region and the first doped region;
   a first salicide portion disposed on the first doped region, the first salicide portion having a first sidewall surface in direct contact with the sidewall of the first doped region that extends to a surface of the non-doped region, a second sidewall surface in contact with a first shallow trench isolation region and an adjacent surface in direct contact with the first doped region, the first salicide portion defined by a salicide block mask positioned between the first doped region and the second doped region; and
   a second salicide portion disposed on the second doped region, the second salicide portion having a first sidewall surface in direct contact with the sidewall of the second doped region that extends to the surface of the non-doped region, a second sidewall surface in direct contact with a second shallow trench isolation region and an adjacent surface in contact with the second doped region, the second salicide portion defined by the salicide block mask.

2. The diode of claim 1, in which current conducts between the first doped region and the second doped region substantially parallel to a surface of the first doped region and a surface of the second doped region.

3. The diode of claim 1, in which no gate is present between the first doped region and the second doped region and no shallow trench isolation region is located between the first doped region and the second doped region.

4. The diode of claim 1, in which the first doped region is defined by a first implant mask, and the second doped region is defined by a second implant mask.

5. The diode of claim 1, in which the first dopant is a p-type dopant and the second dopant is an n-type dopant.

6. The diode of claim 1, integrated into a mobile phone, a set top box, a music player, a video player, an entertainment unit, a navigation device, a computer, a hand-held personal communication systems (PCS) unit, a portable data unit, and/or a fixed location data unit.

7. A diode, comprising:
   a first doped region doped only with a first dopant;
   a second doped region doped only with a second dopant, the second dopant having an opposite polarity of the first dopant;
   means for separating the first doped region from the second doped region, wherein the separating means directly contacts a sidewall of the first doped region and the separating means directly contacts a sidewall of the second doped region, and substantially no lightly doped region lies between the second doped region and the first doped region;
   means for coupling a first contact to the first doped region, the first coupling means having a first sidewall surface in direct contact with the sidewall of the first doped region that extends to a surface of the separating means, a second sidewall surface in direct contact with a first shallow trench isolation region and an adjacent surface in contact with the first doped region; and
   means for coupling a second contact to the second doped region, the second coupling means having a first sidewall surface in direct contact with the sidewall of the second doped region that extends to a surface of the separating means, a second sidewall surface in direct contact with a second shallow trench isolation region and an adjacent surface in contact with the second doped region, in which the first coupling means and the second coupling means are defined by a salicide block mask positioned between the first doped region and the second doped region.

8. The diode of claim 7, in which the diode is integrated into a mobile phone, a set top box, a music player, a video player, an entertainment unit, a navigation device, a computer, a hand-held personal communication systems (PCS) unit, a portable data unit, and/or a fixed location data unit.

* * * * *